United States Patent
Tange

(10) Patent No.: US 8,448,312 B2
(45) Date of Patent: May 28, 2013

(54) METHOD OF MANUFACTURING PACKAGES, PACKAGE, PIEZOELECTRIC, VIBRATOR, AND OSCILLATOR

(75) Inventor: Yoshihisa Tange, Chiba (JP)

(73) Assignee: Seiko Instruments Inc. (JP)

( * ) Notice: Subject to any disclaimer, the term of this patent is extended or adjusted under 35 U.S.C. 154(b) by 82 days.

(21) Appl. No.: 13/135,768

(22) Filed: Jul. 14, 2011

(65) Prior Publication Data

US 2012/0013415 A1    Jan. 19, 2012

(30) Foreign Application Priority Data

Jul. 15, 2010   (JP) ................................. 2010-160642

(51) Int. Cl.
*H01L 41/053* (2006.01)

(52) U.S. Cl.
USPC ............. 29/25.35; 331/68; 331/158; 310/344

(58) Field of Classification Search
USPC .................... 331/158, 68; 29/25.35; 310/344
See application file for complete search history.

(56) References Cited

U.S. PATENT DOCUMENTS

2011/0140793 A1*   6/2011   Numata et al. ................ 331/158

FOREIGN PATENT DOCUMENTS

| DE | 2009157305 | 12/2009 |
|---|---|---|
| JP | 2003209198 | 7/2003 |

* cited by examiner

*Primary Examiner* — Joseph Chang
(74) *Attorney, Agent, or Firm* — Adams & Wilks

(57) ABSTRACT

A method of manufacturing packages includes a welding step for welding a base substrate wafer to a rivet member by heating the base substrate wafer while pressing the same by a forming die from both sides in the thickness direction is provided, wherein a rivet member receiving portion which can receive a distal end of a core member is formed in a receiving die of the forming die, and an inner surface of the rivet member receiving portion is formed into a tapered shape widening from the bottom side toward the opening side.

7 Claims, 11 Drawing Sheets

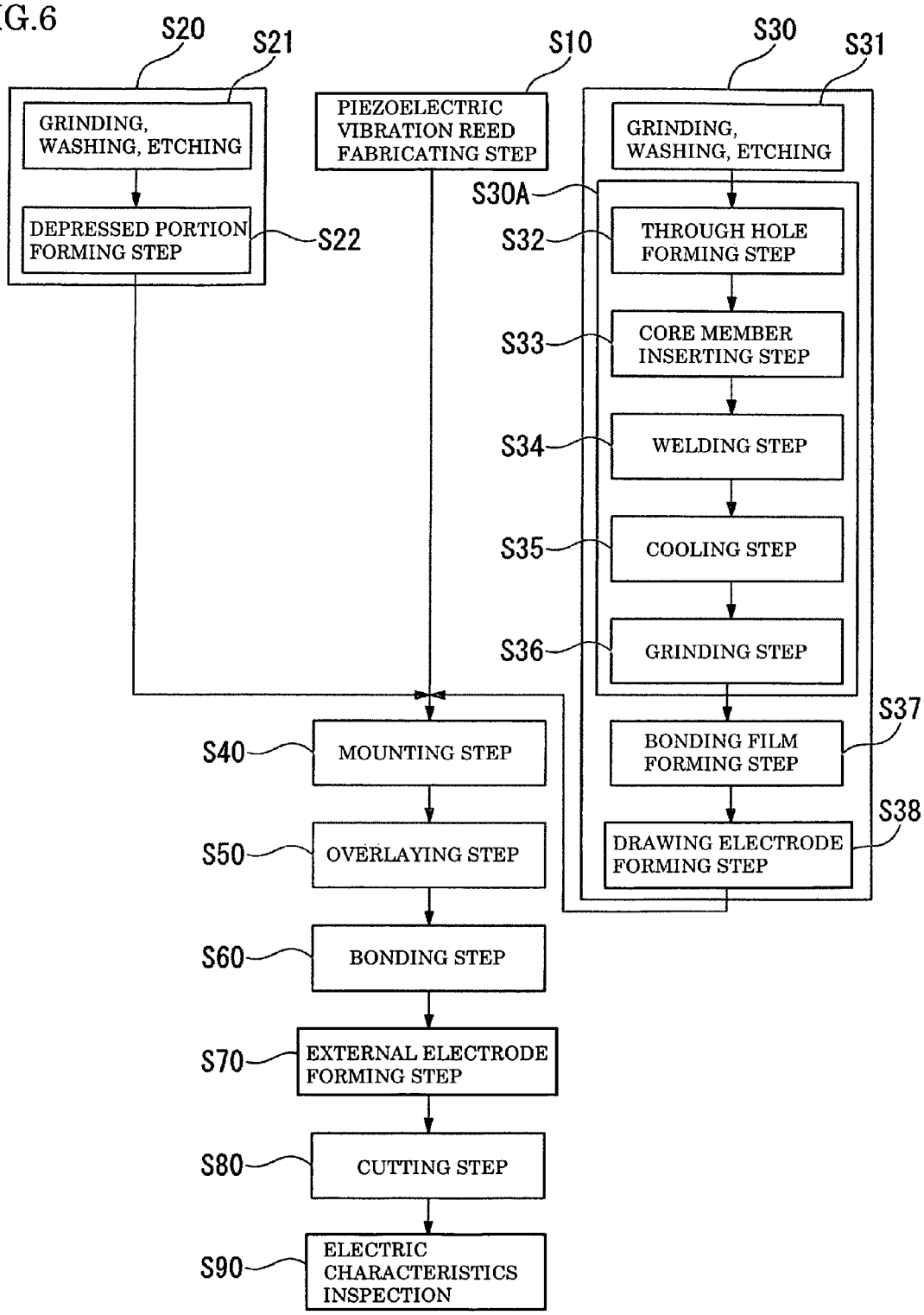

METHOD OF MANUFACTURING PACKAGES, PACKAGE, PIEZOELECTRIC, VIBRATOR, AND OSCILLATOR

BACKGROUND OF THE INVENTION

1. Technical Field

The present invention relates to a method of manufacturing packages, a package, a piezoelectric vibrator, and an oscillator.

2. Description of the Related Art

In recent years, a piezoelectric vibrator (package) using crystal or the like as a time instance source, a timing source for control signals or the like, a reference signal source, and so on in mobile phone sets or portable digital assistant terminal devices is known. Various types of such piezoelectric vibrators are known, and a surface mount (SMD) type piezoelectric vibrator is known as one of these piezoelectric vibrators. The surface mount type piezoelectric vibrator includes a base substrate and a lid substrate formed of, for example, a glass material and joined to each other, and a cavity formed between these substrates, and a piezoelectric vibration reed (electronic component) stored in the cavity sealed in an airtight manner.

In such a piezoelectric vibrator, a configuration in which through electrodes are formed in through holes formed in the base substrate, and the piezoelectric vibration reeds in the cavity and external electrodes out of the cavity are electrically connected via the through electrodes is known.

As a method of forming through electrodes, there is a method of filing the through holes formed on a base substrate with a conductive material such as silver paste or the like and baking the same.

However, with this method, since organic substance such as resin in the silver paste is removed by being baked and hence the volume is reduced, there is a case where depressed portions are formed on the surfaces of the through electrodes or the through electrodes are bored. The depressed portions or bores on the through electrodes may lead to lowering of hermeticity in the cavities or deterioration of conductivity between the piezoelectric vibration reeds and the external electrodes.

Accordingly, in recent years, a method of forming through electrodes by welding metallic pins in the through holes formed through the base substrate is developed (see JP-A-2003-209198). More specifically, through holes for allowing insertion of metallic pins are formed firstly heating the base substrate while pressing with a borer (primary forming). Subsequently, the base substrate is set in a forming die in a state in which the metallic pins are inserted into the through holes, and is heated in a state of being pressed (secondary forming). Accordingly, the melted base substrate (glass material) flows in the forming die and clogs up gaps between the metallic pins and the through holes, and the base substrate is welded to the metallic pins.

Incidentally, when manufacturing the piezoelectric vibrators, through electrodes are formed on a base substrate, then electrode films such as external electrodes which electrically connect the through electrodes and the outside and drawing electrodes which electrically connect the through electrodes and the piezoelectric vibration reeds are formed using Photolithography technique, Spattering method, or the like. Therefore, in order to ensure the continuity between the through electrodes and the electrode film, it is necessary to enhance the positional accuracy of the through electrodes (positional accuracy of the metallic pins) on the base substrate.

However, in the case of the method described above in the secondary forming, the metallic pins move in the forming die with the flow of the glass material (base substrate), so that the metallic pins may be welded in an inclined state or in a state of being displaced from desired positions. Therefore, there is a problem that the positional accuracy of the through electrodes is low.

In contrast, in JP-A-2003-209198, there is described a method in which metallic pins having a base portion and a core member extending from the surface of the base portion upright along the direction of a normal line are used and secondary forming is performed in a state of holding the base portions of the metallic pins in receiving portions formed in the forming die.

However, in order to store the base portions in the receiving portions smoothly at the time of clamping the forming die, it is necessary to set the diameter of the receiving portions to be sufficiently larger than the diameter of the base portions of the metallic pins. In this case, gaps are formed between inner peripheral surfaces of the receiving portions and side surfaces of the base portion. Therefore, in the secondary forming, the base portions move in the receiving portions, and hence significant improvement of the positional accuracy of the through electrodes (the positional accuracy of the metallic pins) cannot be expected.

SUMMARY OF THE INVENTION

Accordingly, it is an object of the invention to provide a method of manufacturing packages which is capable of improving positional accuracy of through electrodes, a package, a piezoelectric vibrator, and an oscillator.

In order to solve the above-described problems, the invention provides the following means.

A method of manufacturing packages according to the invention is a method of manufacturing packages in which an electric component can be sealed in a cavity formed between a mutually bonded plurality of substrates, including: a through electrode forming step for forming a through electrode which penetrates through a through electrode forming substrate out of the plurality of substrates in the thickness direction and brings the inside of the cavity and the outside of the plurality of substrates into continuity, wherein the through electrode forming step includes: a through hole forming step for forming a through hole in the through electrode forming substrate; a metallic pin arranging step for inserting a conductive metallic pin into the through hole; and a welding step for welding the through electrode forming substrate to the metallic pin by heating the through electrode forming substrate while pressing the same by a forming die from the both sides in the thickness direction, wherein a receiving portion that can receive at least one end side of the metallic pin is formed in the forming die, and the receiving portion is formed into a tapered shape having an inner diameter widening from the bottom side to the opening side.

In this configuration, in the welding step, the through electrode forming substrate is heated while being pressed, whereby the through electrode forming substrate flows in the forming die, and clogs up gaps between the metallic pin and the through hole, and hence the through electrode forming substrate is welded to the metallic pin. Therefore, formation of gaps between the through electrode (metallic pin) and the through hole is restrained and hence air-tightness in the cavity is secured.

Here, according to the configuration in the invention, by forming the receiving portion configured to receive at least one end side of the metallic pin in the forming die, the metallic pin is welded to the through electrode forming substrate in a state in which the one end side of the metallic pin is held in the receiving portion. Accordingly, the metallic pins are restrained from being displaced or inclined from a predetermined position in the welding step.

In particular, since the inner surface of the receiving portion is formed into a tapered shape widening from the bottom side toward the opening side, the one end side of the metallic pin can enter smoothly from the side of opening of the receiving portion. In contrast, since the distance between the side surface of the metallic pin and the inner surface of the receiving portion is reduced as the metallic pin proceeds to the bottom side of the receiving portion, by pressing the metallic pin to the bottom side of the receiving portion, the metallic pin can be held at a radially center portion in the receiving portion without being displaced so that the direction of extension of the metallic pin is aligned with the direction of thickness of the through electrode forming substrate.

Also, in the case in which the metallic pin is inserted into the through hole in an inclined state, one end side of the metallic pin is pushed along the inner surfaces (tapered surfaces) of the receiving portion by pressing the through electrode forming substrate in the welding step. Accordingly, the metallic pin is guided to the bottom side of the receiving portion and also to the radially center portion of the receiving portion. Therefore, when the metallic pin reaches the bottom surface of the receiving portion, the metallic pin is positioned so that the direction of extension of the metallic pin matches the direction of thickness of the through electrode forming substrate. Accordingly, the positional accuracy of the through electrode is improved.

Preferably, the length of the metallic pins is longer than the thickness of the through electrode forming substrate, and the metallic pin is inserted so as to be projected from the through electrode forming substrate in the thickness direction in the metallic pin arranging step.

In this configuration, when the through electrode forming substrate is set in the forming die prior to the welding step, one end side of the metallic pin is held in the receiving portion. In other words, since the procedure can be moved to the welding step in a state in which the metallic pin is held in the receiving portions, movement of the metallic pin in the welding step can be reliably restrained.

Preferably, the metallic pin includes a base portion and a core member provided on the surface of the base portion so as to extend upright and configured to be inserted into the through hole in the metallic pin arranging step.

In this configuration, the core members can be inserted into the through hole easily in a state in which the direction of axis of the core members matches the direction of thickness of the through electrode forming substrate by a simple operation only to insert the metallic pin until the base portions come into contact with the through electrode forming substrate. Therefore, the operability in the metallic pin arranging step can be improved, and the positional accuracy of the through electrode after the welding step is improved.

A package according to the invention is characterized by being manufactured by a method of manufacturing packages according to the invention described above.

In this configuration, by manufacturing the package using the method of manufacturing the package in the invention described above, a package superior in positional accuracy of the through electrode is provided and the continuity between the through electrode and an electrode film can be secured.

A piezoelectric vibrator includes a piezoelectric vibration reed sealed in an air-tight manner in the cavity of the package according to the invention described above.

In this configuration, since the package according to the invention described above is provided, the conductivity between the piezoelectric vibration reed and the through electrode is secured. Since the through electrode forming substrate is welded to the core member, the air-tightness in the cavity is secured. Consequently, the highly reliable piezoelectric vibrator can be provided.

Also, an oscillator according to the invention includes the piezoelectric vibrator according to the invention described above is characterized by being electrically connected to an integrated circuit as an oscillation element.

In this configuration, since the piezoelectric vibrator in which the continuity between the piezoelectric vibration reed and the through electrode is stable secured is used, a highly reliable oscillator is provided.

According to the method of manufacturing the package, and the package in the invention, the positional accuracy of the through electrode is improved.

Also, according to the piezoelectric vibrator in the invention, since the package according to the invention described above is provided, a highly reliable piezoelectric vibrator is provided.

In the oscillator according to the invention, since the piezoelectric vibrator according to the invention described above is employed, a highly reliable oscillator is provided.

BRIEF DESCRIPTION OF THE DRAWINGS

FIG. 6 is a flowchart of a method of manufacturing the piezoelectric vibrators according to the embodiment;

DESCRIPTION OF THE PREFERRED EMBODIMENTS

Figure 1:
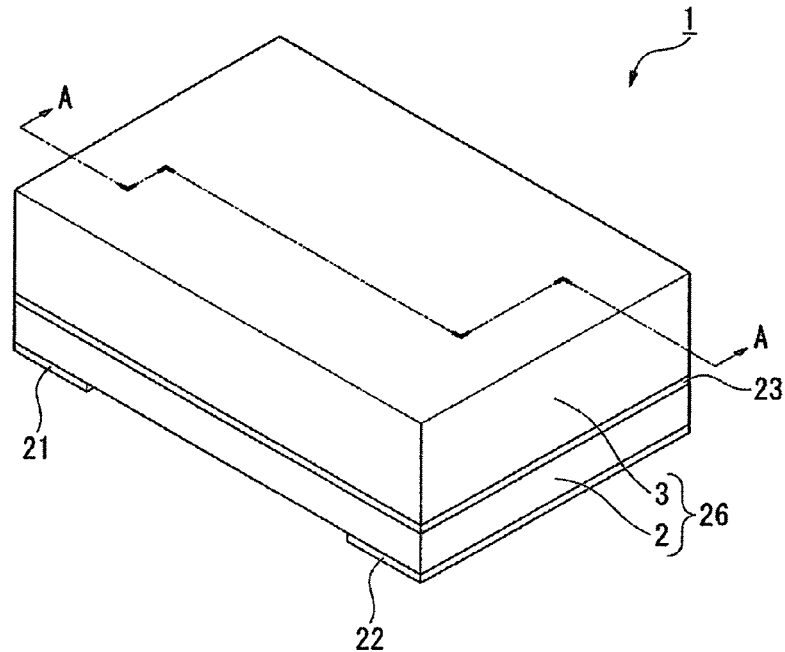
FIG. 1 is an appearance perspective view of a piezoelectric vibrator according to an embodiment.

Referring now to the drawings, an embodiment of the invention will be described.
(Piezoelectric Vibrator)

Figure 2:
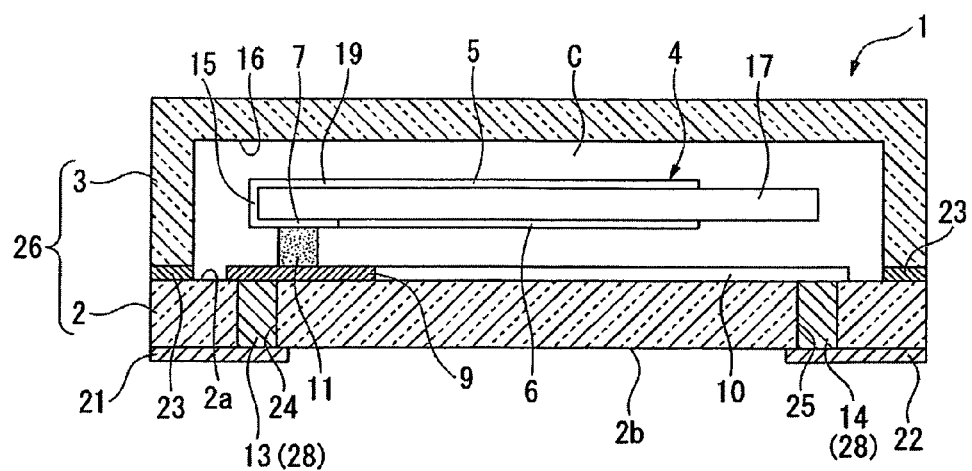
FIG. 2 is a cross-sectional view taken along the line A-A in FIG. 1.
Figure 3:
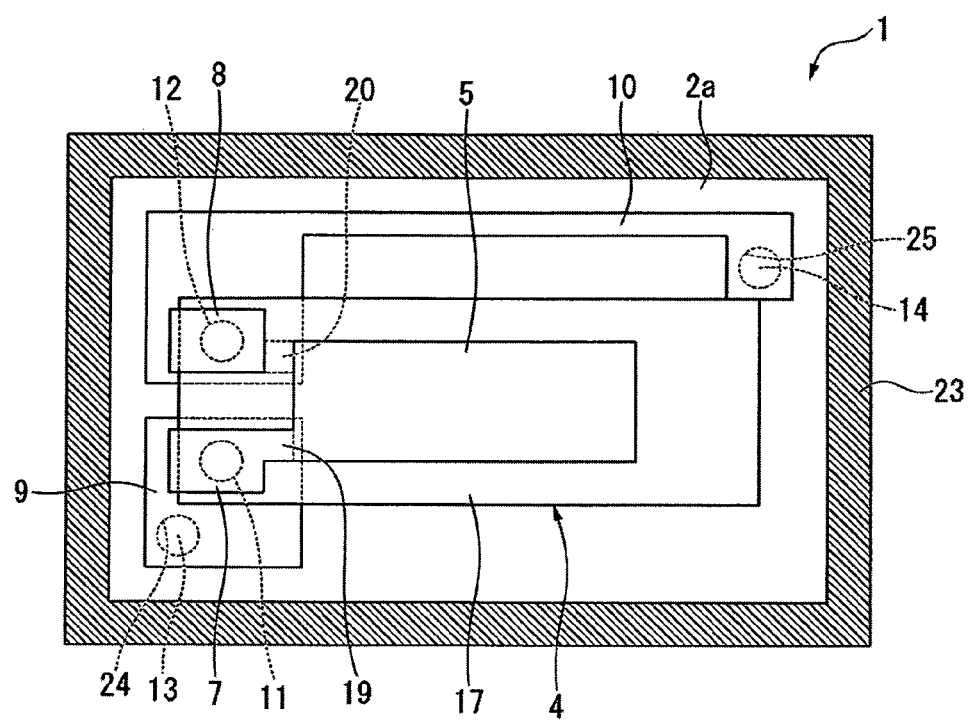
FIG. 3 is a plan view showing a state in which a lid substrate of the piezoelectric vibrator is removed.
Figure 4:
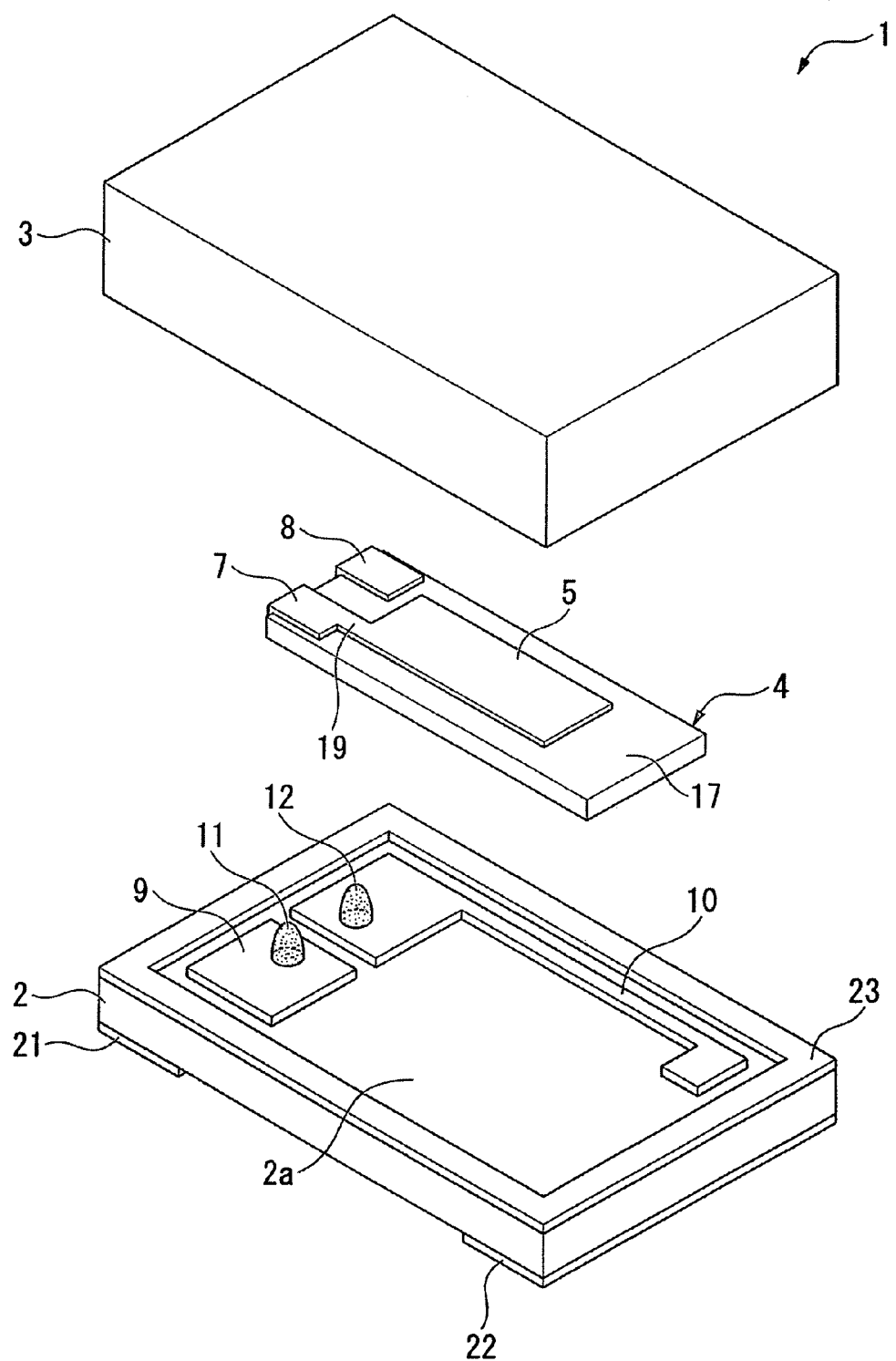
FIG. 4 is an exploded perspective view of the piezoelectric vibrator.

Referring now to the drawings, an embodiment of a piezoelectric vibrator according to the invention will be described. FIG. 1 is an appearance perspective view of a piezoelectric vibrator according to an embodiment. FIG. 2 is a cross-sectional view taken along the line A-A in FIG. 1. FIG. 3 is a plan view showing a state in which a lid substrate of the piezoelectric vibrator is removed. FIG. 4 is an exploded perspective view of the piezoelectric vibrator.

As shown in FIG. 1 to FIG. 4, a piezoelectric vibrator 1 according to this embodiment is the surface mount type piezoelectric vibrator 1 having a package 26 having a base substrate (through electrode forming substrate) 2 and a lid substrate 3 formed by anodic wafer bonding via a bonding film 23, and a piezoelectric vibration reed 4 stored in a cavity C of the package 26.

The piezoelectric vibration reed 4 is an AT cut type vibration reed formed of a piezoelectric material such as crystal and is configured to vibrate when a predetermined voltage is applied thereto.

The piezoelectric vibration reed 4 includes a quartz panel 17 machined to a panel shape being substantially square in plan view and having a uniform thickness, a pair of excitation electrodes 5 and 6 arranged on both surfaces of the quartz panel 17 at opposing positions, leading electrodes 19 and 20 electrically connected to the excitation electrodes 5 and 6, and mount electrodes 7 and 8 electrically connected to the leading electrodes 19 and 20. The mount electrode 7 is electrically connected to a side electrode 15 of the quartz panel 17, and is electrically connected to the mount electrode 7 formed on the surface on the side where the excitation electrode 6 is formed.

The excitation electrodes 5 and 6, the leading electrodes 19 and 20, the mount electrodes 7 and 8, and the side electrode 15 are formed, for example, of coating films of gold (Au). These films may be formed of electrically conductive coating films such as chrome (Cr), nickel (Ni), Aluminum (Al) or Titanium (Ti) or the like, or a laminated film which is a combination of some of these conductive films.

The piezoelectric vibration reed 4 configured in this manner is bonded by bump-bonding to a first surface 2a (upper surface side) of the base substrate 2 while utilizing bumps 11 and 12 formed of gold. More specifically, a pair of mount electrodes 7 and 8 are formed on drawing electrodes 9 and 10, described later, patterned on the first surface 2a of the base substrate 2 and are bump-bonded to the bumps 11 and 12 with a pair of the mount electrodes 7 and 8 being in contact therewith respectively. Accordingly, the piezoelectric vibration reed 4 is supported in a state of being lifted from the first surface 2a of the base substrate 2 by an amount corresponding to the thickness of the bumps 11 and 12, and the mount electrodes 7 and 8 and the drawing electrodes 9 and 10 are electrically connected, respectively.

The lid substrate 3 is a substrate formed of a glass material, for example, soda-lime glass, and a rectangular depressed portion 16 which allows fitting of the piezoelectric vibration reed 4 is formed on the side of the bonding surface to which the base substrate 2 is bonded. The depressed portion 16 is the depressed portion 16 for the cavity which is the cavity C for storing the piezoelectric vibration reed 4 when the base substrate 2 and the lid substrate 3 are placed on top of another. Then, the lid substrate 3 is anodically bonded to the base substrate 2 in a state in which the depressed portion 16 is opposed to the base substrate 2.

The base substrate 2 is a substrate formed of a glass material, for example, soda-lime glass, and is formed into substantially a panel shape of a size which can be overlaid the lid substrate 3.

The base substrate 2 is formed with a pair of through holes 24 and 25 which penetrate through the base substrate 2. One end of each of the through holes 24 and 25 is formed so as to face the interior of the cavity C. More specifically, the through holes 24 and 25 are formed at diagonal corners of the base substrate 2, and penetrate through the base substrate 2 in substantially a column shape along a direction parallel to the thickness thereof.

Then, the pair of through holes 24 and 25 are formed with a pair of through electrodes 13 and 14 formed so as to clog up the through holes 24 and 25. The through electrodes 13 and 14 clog up the through holes 24 and 25 to maintain air-tightness in the cavity C, and serve to bring external electrodes 21 and 22, described later, and the drawing electrodes 9 and 10 into continuity. The through electrodes 13 and 14 are each formed of a core member 28 formed of a conductive metallic material disposed in each of the through holes 24 and 25, so that the core members 28 ensure stable electric continuity.

The core members 28 are fixed by being welded to the base substrate 2, and the core members 28 clog up the through holes 24 and 25 completely to maintain the air-tightness in the cavity C. The core member 28 is a conductive metal core member formed into a column shape of a material having a coefficient of thermal expansion which is close to (preferably, equivalent or slightly lower than) the glass material of the base substrate 2, for example, such as Kovar or Fe—Ni alloy (42 alloy), is flat at both ends and has the same thickness as the base substrate 2.

Figure 5A:
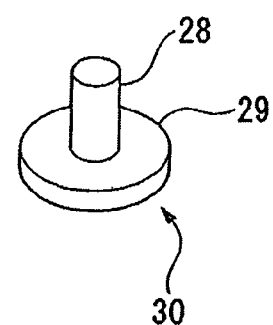
FIGS. 5A and 5B are perspective views of a rivet member used when manufacturing the piezoelectric vibrator shown in FIG. 1.
Figure 5B:
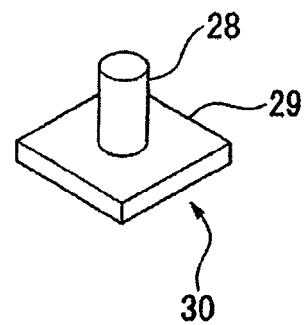

When the through electrodes 13 and 14 are formed as complete members, the core members 28 are formed into a column shape having the same thickness as the base substrate 2 described above. However, in the course of manufacture, as shown in FIG. 5A, it is formed so as to project in the direction of the normal line from the surface of a disk-shaped base portion 29 and form a rivet member 30 in cooperation with the base portion 29. For example, the dimensions of the rivet member 30 are such that the length of the core member 28 is on the order of 0.48 mm, the outer diameter of the core member 28 is on the order of 0.15 mm, the thickness of the base portion 29 is on the order of 0.05 mm, the outer diameter of the base portion 29 is on the order of 0.30 mm. The shape of the base portion 29 in plan view is not limited to a circular shape, and may be a square shape as shown in FIG. 5B.

Returning back to FIG. 2 to FIG. 4, the bonding film 23 for anodic wafer bonding and a pair of drawing electrodes 9 and 10 are patterned using a conductive material (for example, aluminum, silicon, and the like) on the side of the first surface 2a of the base substrate 2. The bonding film 23 is formed along the periphery of the base substrate 2 so as to surround the periphery of the depressed portion 16 formed on the lid substrate 3.

The pair of drawing electrodes 9 and 10 are patterned so as to electrically connect the through electrode 13, which is one of the pair of through electrodes 13 and 14, and the mount electrode 7 which is one of the mount electrodes of the piezoelectric vibration reed 4, and electrically connect the other through electrode 14 and the other mount electrode 8. More specifically, the one drawing electrode 9 is formed right above the one through electrode 13 so as to be positioned on the side of the mount electrodes 7 and 8 of the piezoelectric vibration reed 4. In contrast, the other drawing electrode 10 is formed so as to be drawn from a position adjacent to the one drawing electrode 9 along the piezoelectric vibration reed 4 to the side opposing the through electrode 13 on the base substrate 2 and then positioned right above the other through electrode 14.

Then, the bumps 11 and 12 are formed on the pair of drawing electrodes 9 and 10, and the piezoelectric vibration reed 4 is mounted using the bumps 11 and 12. Accordingly, the one mount electrodes 7 of the piezoelectric vibration reed 4 is brought into conduction with the one through electrode 13 via the one drawing electrode 9, and the other mount electrode 8 is brought into conduction with the other through electrode 14 via the other drawing electrode 10.

The external electrodes 21 and 22 which are electrically connected to a pair of the through electrodes 13 and 14 respectively are formed on the second surface 2b (lower surface) of the base substrate 2. In other words, the one external electrode 21 is electrically connected to the first excitation electrode 5 of the piezoelectric vibration reed 4 via the one through electrode 13 and the one drawing electrode 9. Also, the other external electrode 22 is electrically connected to the second excitation electrode 6 of the piezoelectric vibration reed 4 via the other through electrode 14 and the other drawing electrode 10.

When activating the piezoelectric vibrator 1 configured in this manner, a predetermined drive voltage is applied to the external electrodes 21 and 22 formed on the base substrate 2. Accordingly, an electric current can be flowed to the excitation electrode including the first excitation electrode 5 and the second excitation electrode 6 of the piezoelectric vibration reed 4, so that the piezoelectric vibration reed 4 can be vibrated at a predetermined frequency. Then, the vibration can be used as a timing source of control signal, a reference signal source, and so on.

(Method of Manufacturing Piezoelectric Vibrator)

Figure 7:
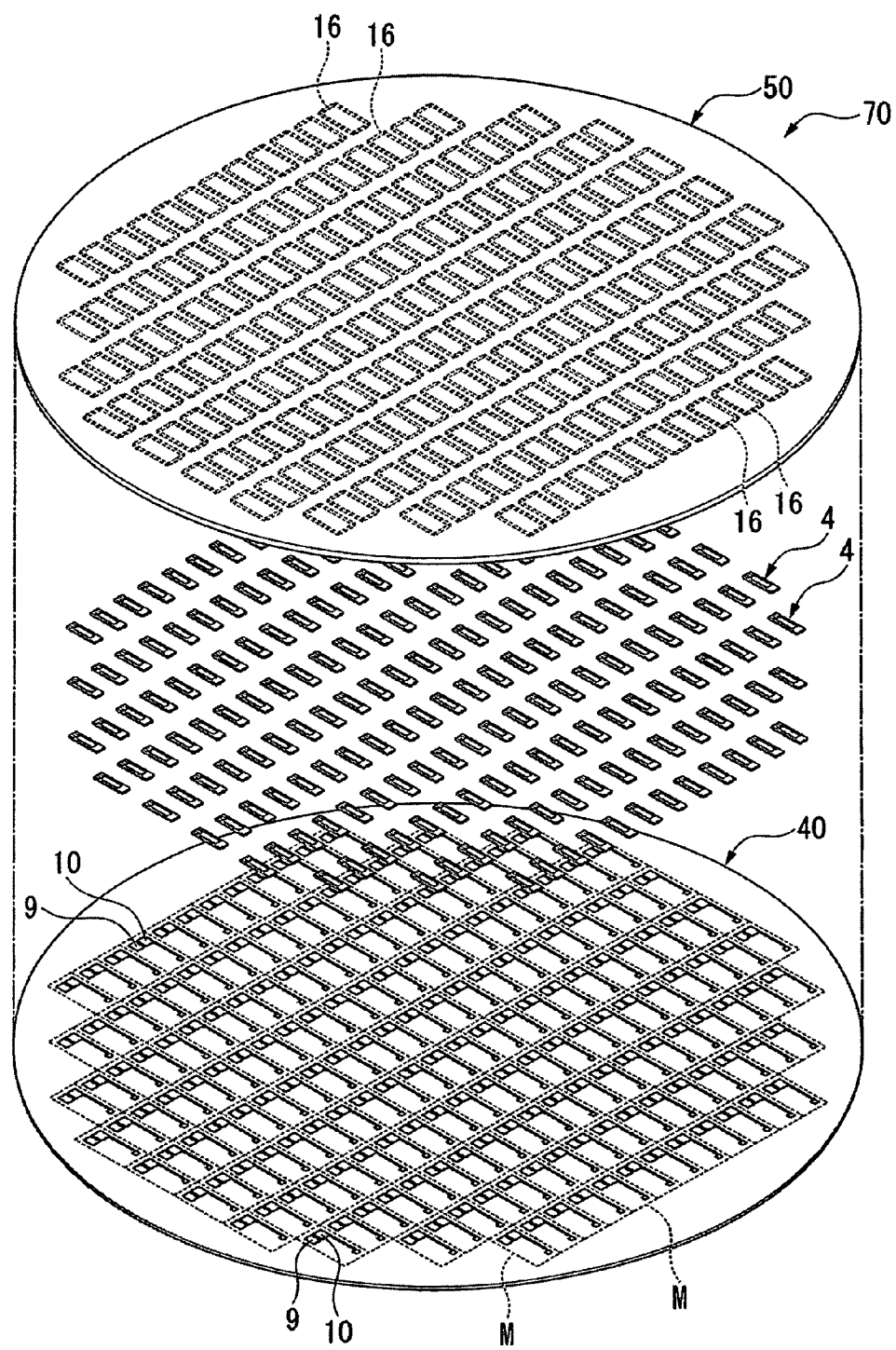
FIG. 7 is an exploded perspective view of a bonded wafer member.

Subsequently, a method of manufacturing the above-described piezoelectric vibrator will be described. FIG. 6 is a flowchart showing a method of manufacturing the piezoelectric vibrator according to this embodiment. FIG. 7 is an exploded perspective view of a bonded wafer member. Described below is, as shown in FIG. 7, a method of manufacturing a plurality of the piezoelectric vibrators 1 simultaneously by placing a plurality of the piezoelectric vibration reeds 4 between a base substrate wafer 40 having a plurality of the base substrates 2 arranged continuously thereon and a lid substrate wafer 50 having a plurality of the lid substrates 3 arranged continuously thereon in a sealed manner to form a bonded wafer member 70, and cutting the bonded wafer member 70 into pieces. Broken lines M shown in FIG. 7 are cutting lines to be cut in a cutting step.

As shown in FIG. 6, a method of manufacturing the piezoelectric vibrator according to this embodiment mainly includes a piezoelectric vibration reed fabricating step (S10), a lid substrate wafer fabricating step (S20), and a base substrate wafer fabricating step (S30). From among these steps, the piezoelectric vibration reed fabricating step (S10), the lid substrate wafer fabricating step (S20), and the base substrate wafer fabricating step (S30) can be performed simultaneously.

First of all, the piezoelectric vibration reed fabricating step is performed to fabricate the piezoelectric vibration reed 4 shown in FIG. 2 to FIG. 4 (S10). More specifically, Lambert row stone of crystal is sliced at a predetermined angle to obtain a wafer of a certain thickness. Subsequently, the wafer is wrapped and coarsely machined, and then mirror grinding such as polishing is performed to obtain a wafer having a predetermined thickness. However, the mirror grinding such as polishing might not be performed in some cases. Subsequently, after having treated the wafer adequately such as washing, patterning of the outer shape of the piezoelectric vibration reed 4 is performed on the wafer and then formation and patterning of a metallic film are performed thereon with lithography technique or a metal masking or the like, so that the excitation electrodes 5 and 6, the leading electrodes 19 and 20, the mount electrodes 7 and 8, and the side electrode 15 are formed. Accordingly, the plurality of piezoelectric vibration reeds 4 can be fabricated.

(Lid Substrate Wafer Fabricating Step)

Subsequently, as shown in FIG. 7, the lid substrate wafer fabricating step (S20) for fabricating the lid substrate wafer which becomes the lid substrate 3 later to a state immediately before anodic wafer bonding is performed. First of all, after having grinded the lid substrate wafer 50 formed of the soda-lime glass to a predetermined thickness and washed the same, the lid substrate wafer 50 of a disc shape having the affected layer on the topmost surface thereof removed by etching or the like is formed (S21). Subsequently, a depressed portion forming step (S22) for forming a plurality of the depressed portions 16 for cavities C in the direction of arrangement of rows by a method of etching, embossing or the like on a bonding surface of the lid substrate wafer 50 is performed. When the depressed portions 16 are formed, the surface on which the depressed portions 16 are formed is grinded for a bonding step (S60) described later. At this time point, the lid substrate wafer fabricating step (S20) is ended.

(Base Substrate Wafer Fabricating Step)

FIGS. 8A to 10C are cross-sectional views of the base substrate wafer and are process drawings for explaining the base substrate wafer fabricating step.

Figure 8A:
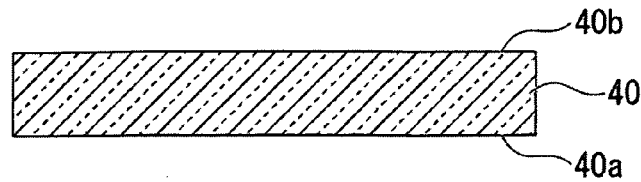
FIGS. 8A to 8D are cross-sectional views of a base substrate wafer and are process drawings for explaining a through electrode forming step.

Subsequently, simultaneously with or a timing before or after the lid substrate wafer fabricating step (S20), the base substrate wafer fabricating step (S30) configured to fabricate the base substrate wafer 40 which becomes the base substrate 2 later. First of all, the base substrate wafer 40 as shown in FIG. 8A is formed. More specifically, after having grinded the soda-lime glass to a predetermined thickness and washed the same, the affected layer on the topmost surface is removed by etching or the like (S31).

(Through Electrode Forming Step)

Subsequently, a through electrode forming step (S30A) for forming the through electrodes 13 and 14 on the base substrate wafer 40 is performed.

(Through Hole Forming Step)

Figure 8B:
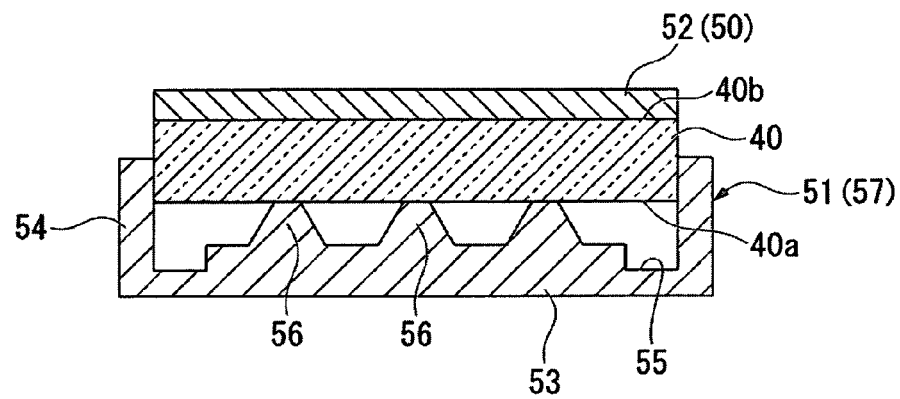

First of all, the through holes 24 and 25 (see FIG. 2) penetrating through the base substrate wafer 40 are formed (S32). Formation of the through holes 24 and 25 are performed using, for example, a through hole forming die 57 formed of carbon or the like, by heating the base substrate wafer 40 in a state of pressing the same as shown in FIG. 8B.

The through hole forming die 57 includes a receiving die 51 for holding the base substrate wafer 40 on the side of a first surface 40a and a pressurizing die 52 for pressing the base substrate wafer 40 from a second surface 40b side in the direction of thickness.

The pressurizing die 52 is formed to have an equivalent outer diameter to the base substrate wafer 40, and is a flat member which comes into contact with the second surface 40b of the base substrate wafer 40 when pressing the base substrate wafer 40.

The receiving die 51 is formed into a depressed shape in cross section, and is configured to accommodate the base substrate wafer 40. More specifically, the receiving die 51 includes a bottom wall portion 53 opposing a first surface 10a of the base substrate wafer 40, and a side wall portion 54 extending upright along the circumference of the outer peripheral edge of the bottom wall portion 53.

Formed on the inner surface on the bottom wall portion 53 along the outer peripheral portion is a receiving depression 55 depressed along the direction of thickness. The receiving depression 55 is formed into a ring shape along the circumference of the bottom wall portion 53. Then, formed in the center portion in the inner surface of the bottom wall portion 53 (in the area surrounded by the receiving depression 55) are a plurality of receiving projections 56 projecting in the direction of thickness. The receiving projections 56 form depressed portions 41 which correspond to the through holes and 25 (see FIG. 8D), and are formed at positions corresponding to the position of formation of the through holes 24 and 25 on the base substrate wafer 40. Each of the receiving projections 56 is formed with a taper on a side surface thereof for due cutting, and the shapes of the substantially truncated conical-shaped receiving projections 56 are transferred to the base substrate wafer 40.

In the through hole forming step (S32), the base substrate wafer 40 is set into the receiving die 51 in a state in which the receiving die 51 of the through hole forming die 57 is set with the receiving projections 56 facing upward. In this case, the base substrate wafer 40 is set so that the first surface 40*a* comes into abutment with distal end surfaces of the receiving projections 56. In addition, the pressurizing die 52 of the through hole forming die 57 is set so as to come into contact with the second surface 40*b* of the base substrate wafer 40, so that the base substrate wafer 40 is clamped between the receiving die 51 and the pressurizing die 52 in the thickness direction.

Figure 8C:
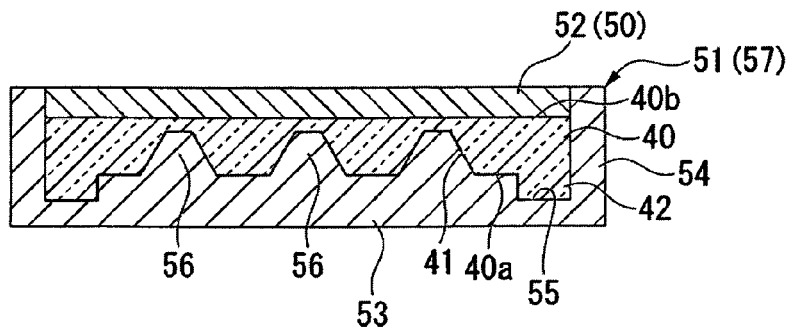

Then, as shown in FIG. 8C, the base substrate wafer 40 is set in a heating furnace in a state of being set in the through hole forming die 57, and is applied with a pressure along the direction of thickness of the base substrate wafer 40 by the pressurizing die 52 at a high temperature such as approximately 900°. Then, the depressed portions 41 formed by the shape of the receiving projections 56 being transferred thereto are formed in the center portion of the first surface 40*a* of the base substrate wafer 40, while projecting portions 42 formed by the shape of the receiving depression 55 being transferred thereto are formed in the outer peripheral portion. Then, the base substrate wafer 40 is cooled by being gradually reduced in temperature.

Figure 8D:
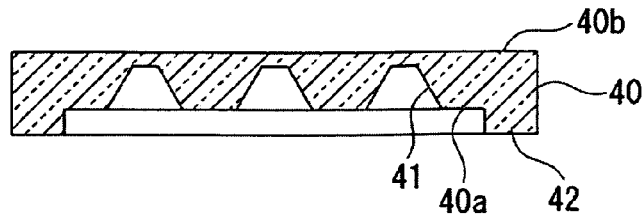

Accordingly, as shown in FIG. 8D, the projecting portions 42 projecting in the direction of thickness along the entire periphery of the outer peripheral edge and a plurality of tapered depressed portions 41 which are formed in the center portion of the first surface 40*a* (the area inside the projecting portion 42) and become the through holes 24 and 25 later are formed on the side of the first surface 40*a* of the base substrate wafer 40. The depressed portions 41 are formed at positions on the base substrate wafer 40 where the through holes 24 and 25 are formed.

Figure 9A:
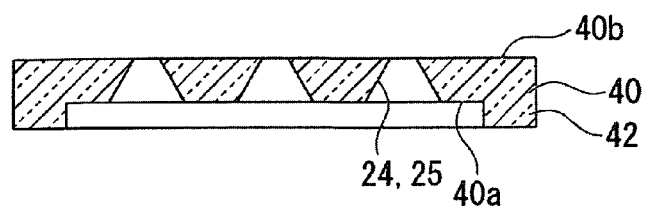
FIGS. 9A to 9C are cross-sectional views of the base substrate wafer and are process drawings for explaining the through electrode forming step.

Subsequently, as shown in FIG. 9A, the through holes 24 and 25 having a substantially truncated conical shape are formed on the base substrate wafer 40 by grinding at least the second surface 40*b* of the base substrate wafer 40 and causing the depressed portions 41 to penetrate through the base substrate wafer 40 along the direction of thickness. In this case, for example, dimensions of the base substrate wafer 40 are such that the thickness (the thickness from the first surface 40*a* to the second surface 40*b*) is on the order of 0.35 mm, the height of the projecting portion 42 is on the order of 0.20 mm, the diameter of the through holes 24 and 25 on the small-diameter side (the side of the second surface 40*b*) is on the order of 0.20 mm. For reference sake, the above-described grinding may be omitted by causing the receiving projections 56 of the through hole forming die 57 to penetrate through the base substrate wafer 40 when heating the base substrate wafer 40.

(Core Member Inserting Step)

Subsequently, a core member inserting step (metallic pin arranging step) (S33) for inserting the core members 28 into the through holes 24 and 25 is performed.

Figure 9B:
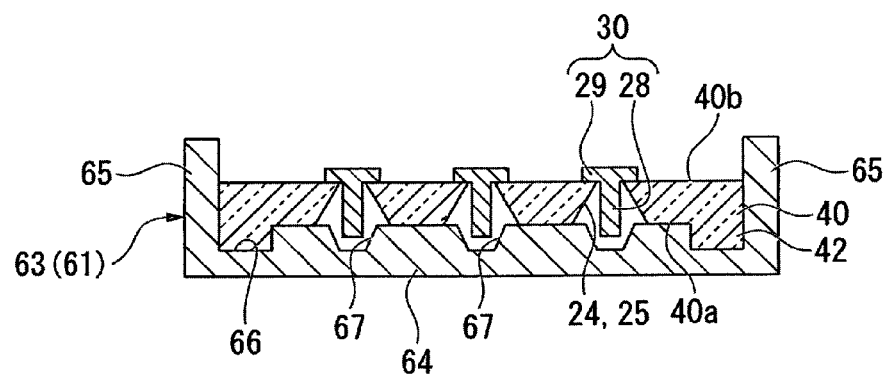

As shown in FIG. 9B, in the core member inserting step (S33), the core members 28 of the rivet members 30 are inserted into the through holes 24 and 25 in a state in which the base substrate wafer 40 is set into a receiving die 63 of a forming die 61 formed of, for example, carbon or the like.

The forming die 61 will now be described.

Figure 9C:
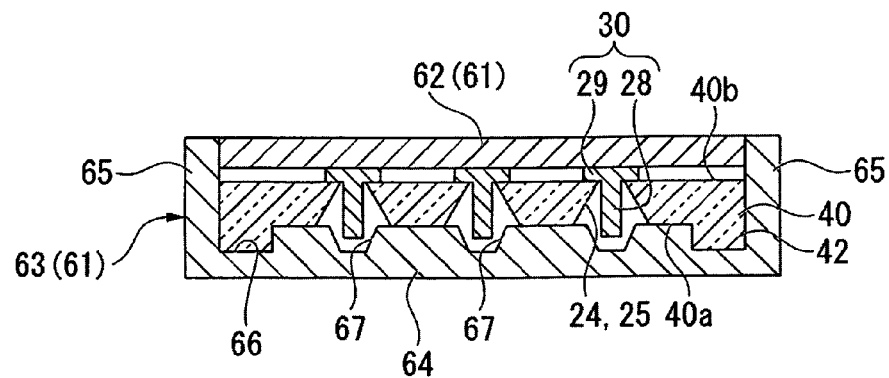

As shown in FIG. 9C, the forming die 61 includes the receiving die 63 for holding the base substrate wafer 40 on the side of the first surface 40*a* and a pressurizing die 62 for pressing the base substrate wafer 40 from the second surface 40*b* side in the direction of thickness.

The pressurizing die 62 is formed to have an equivalent outer diameter to the base substrate wafer 40, and is a flat member which comes into contact with the second surface 40*b* of the base substrate wafer 40 when pressing the base substrate wafer 40.

The receiving die 63 is formed into a depressed shape in cross section, and is configured to accommodate the base substrate wafer 40. More specifically, the receiving die 63 includes a bottom wall portion 64 opposing the first surface 40*a* of the base substrate wafer 40, and a side wall portion 65 extending upright in the direction of thickness of the bottom wall portion 64 along the circumference of the outer peripheral edge of the bottom wall portion 64.

A receiving depression 66 depressed along the direction of thickness is formed in a ring shape on the inner surface along the outer peripheral portion of the bottom wall portion 64 along the circumference of the bottom wall portion 64. The depth of the receiving depression 66 is formed to be equivalent to the height of the projecting portion 42 of the base substrate wafer 40 after the through hole forming step (S32).

Then, formed at the center portion of the bottom wall portion 64 (in the area surrounded by the receiving depression 66), a plurality of rivet member receiving portions 67 depressed in the direction of thickness. The rivet member receiving portions 67 each are a truncated conical shaped depression formed so that the center axis thereof matches the center axes of the through holes 24 and 25 of the base substrate wafer 40. The inner surface of each of the rivet member receiving portion 67 is formed into a tapered shape increasing in inner diameter thereof from the bottom side to the opening side. In this case, the diameter on the bottom side of the rivet member receiving portions 67 is on the order of 0.20 mm, the diameter on the opening side is on the order of 0.22 mm, the depth of the rivet member receiving portions 67 is on the order of 0.20 mm, and the gradient of the inner surface of the rivet member receiving portions 67 is on the order of 10°, for example.

Then, as shown in FIG. 9B, in the core member inserting step (S33), the base substrate wafer 40 is set into the receiving die 63 so that the second surface 40*b* faces upward. In this case, the base substrate wafer 40 is set into the receiving die 63 in a state in which the first surface 40*a* of the base substrate wafer 40 comes into abutment with the bottom wall portion 64, and the projecting portion 42 of the base substrate wafer 40 enters the receiving depression 66. In this state, the core members 28 of the rivet members 30 are inserted into the through holes 24 and 25 from the small-diameter side (the side of the second surface 40*b*) using a nesting machine.

Then, the core members 28 are inserted into the through holes 24 and 25 until the surfaces of the base portions 29 come into abutment with the second surface 40*b* of the base substrate wafer 40. In this case, since the core members 28 project from the surfaces of the base portions 29 in the direction of normal line, the core members 28 can be inserted into the through holes 24 and 25 easily in a state in which the direction of extension of the core members 28 matches the direction of thickness of the base substrate wafer 40 by a simple operation only to insert the core member 28 until the base portions 29 come into contact with the base substrate wafer 40. Therefore, the operability in the core member inserting step (S33) can be improved.

Since the length of the core member 28 is formed to be longer than the thickness of the base substrate wafer 40, distal end portions of the core members 28 project from the first surface 40a of the base substrate wafer 40 in a state in which the core members 28 are inserted into the through holes 24 and 25. Therefore, the distal end side (one end side) of the core member 28 is held in a state of being entered into the rivet member receiving portions 67. In this case, since the rivet member receiving portions 67 are formed into a tapered shape extending from the bottom side toward the opening side, the diameter of the rivet member receiving portions 67 on the opening side is sufficiently larger than the diameter of the core members 28. Therefore, the distal end sides of the core members 28 enter smoothly from the opening side of the rivet member receiving portions 67.

In this state, slight gaps are formed between the bottom portions of the rivet member receiving portions 67 and the distal end surfaces of the core members 28. Therefore, in a welding step (S34) described later, expansion of the core members 28 due to heating can be released. When pressing the base substrate wafer 40 by the pressurizing die 62, the pressure is not applied to the core members 28 from the pressurizing die 62, so that deformation or displacement of the core members 28 can be prevented.

(Welding Step)

Figure 10A:
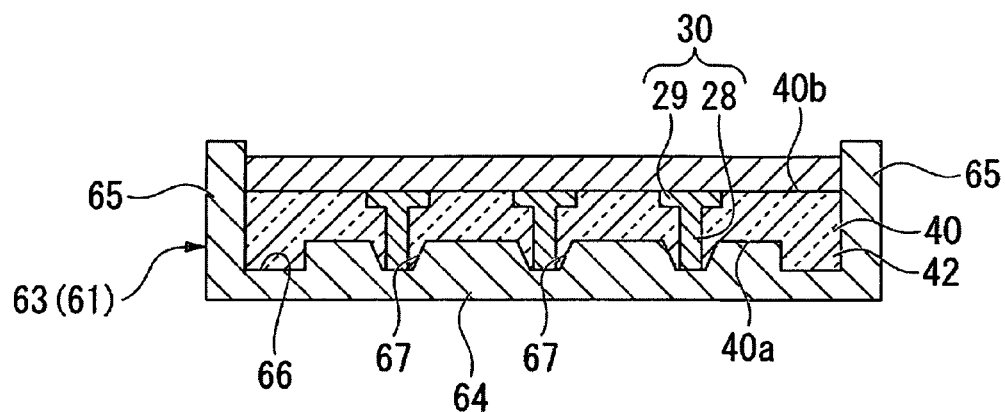
FIGS. 10A to 10C are cross-sectional views of the base substrate wafer and are process drawings for explaining the through electrode forming step.

Subsequently, a step of heating the base substrate wafer 40 and welding the base substrate wafer 40 to the core members (the rivet members 30) is performed (S34). As shown in FIG. 10A, the welding step (S34) is performed by heating the base substrate wafer 40 set in the receiving die 63 in a state of pressing the same with the pressurizing die 62. More specifically, the pressurizing die 62 of the forming die 61 is set so as to come into contact with the second surface 40b of the base substrate wafer 40 in which the rivet members 30 (the core members 28) are inserted, and the base substrate wafer 40 is clamped between the receiving die 63 and the pressurizing die 62 in the thickness direction.

In this state, the forming die 61 is placed on a metal mesh belt first, and is placed into the heating furnace held under the atmosphere. Then, a pressure of, for example, 30 to 50 g/cm$^2$ is applied to the base substrate wafer 40 in the thickness direction using a press machine or the like arranged in the heating furnace. The heating temperature is higher than a deformation temperature (for example 545° C.) of a glass material of the base substrate wafer 40, which is, for example, about 900° C.

Then, by pressurizing the base substrate wafer 40 in a high temperature state, the melted glass material (base substrate wafer 40) flows in the forming die 60 to clog up the gaps between the core members 28 and the through holes 24 and 25, and the base substrate wafer 40 is welded to the core members 28, so that the core members 28 clog up the through holes 24 and 25.

In this embodiment, in the welding step (S34), when the base substrate wafer 40 is melted and flows in the forming die 60, since the rivet members 30 are pushed in the direction of thickness of the base substrate wafer 40 by the pressurizing die 62, the distal end surfaces of the core members 28 abut against the bottom surfaces of the rivet member receiving portions 67. Accordingly, the core members 28 are welded to the base substrate wafer 40 in a state in which the direction of extension of the core members 28 match the direction of thickness of the base substrate wafer 40. In this case, the core members 28 are positioned in a state in which approximately halves of the distal end sides (one end sides) thereof are entered into the rivet member receiving portions 67.

Incidentally, in the core member inserting step (S33) described above, if the core members 28 are inserted into the through holes 24 and 25 in an inclined state or the rivet members are moved in an inclined direction (the direction intersecting the thickness direction of the base substrate wafer 40) in the welding step (S34), there is a risk that the rivet members 30 are welded in a state in which the core members 28 are inclined or the core members 28 are displaced from desired positions.

Figure 11A:
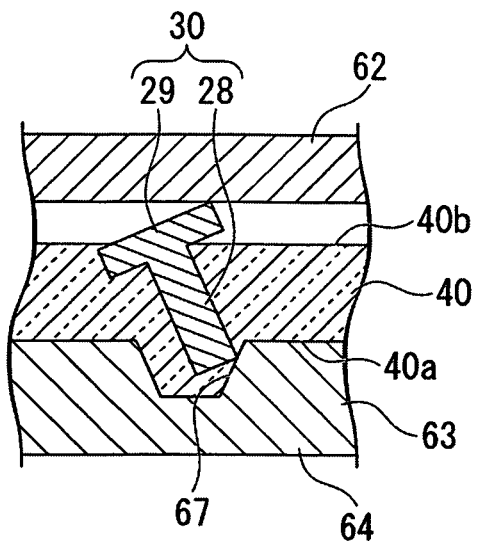
FIGS. 11A to 11C are cross-sectional views of the base substrate wafer are process drawings for explaining a welding step.
Figure 11B:
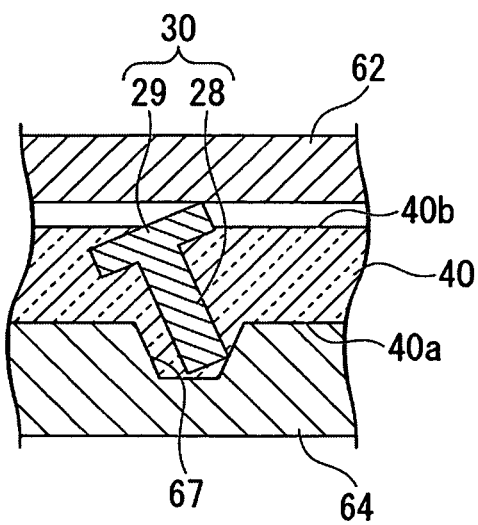
Figure 11C:
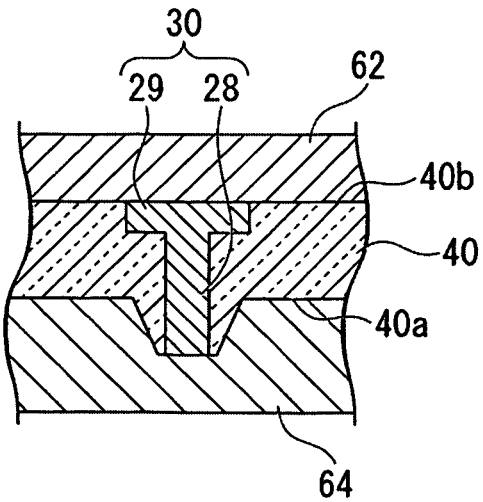

In contrast, in this embodiment, since the inner surfaces of the rivet member receiving portions 67 are formed into a tapered shape, when the rivet members 30 are pushed in a state in which the base substrate wafer 40 is melted, the distal ends of the core members 28 come into contact with the inner surfaces (tapered surfaces) of the rivet member receiving portions 67 as shown in FIG. 11A. Then, as shown in FIG. 11B, the core members 28 are pushed with the distal ends thereof and are guided along the inner surfaces of the rivet member receiving portions 67, so that the distal ends are guided to radially center portions of the rivet member receiving portions 67 as they go toward the bottom portions of the rivet member receiving portions 67. In addition, the core members 28 arise gradually so that the direction of extension of the core members 28 matches the direction of thickness of the base substrate wafer 40. Subsequently, the rivet members 30 are pushed further inward, and the distal end surfaces of the core members 28 come into abutment with the bottom surfaces of the rivet member receiving portions 67. Accordingly, as shown in FIG. 11C, the distal end portions of the core members 28 are stored at the radially center portions in the rivet member receiving portions 67 in a state in which the direction of extension of the core members 28 matches the direction of thickness of the base substrate wafer 40.

Figure 10B:
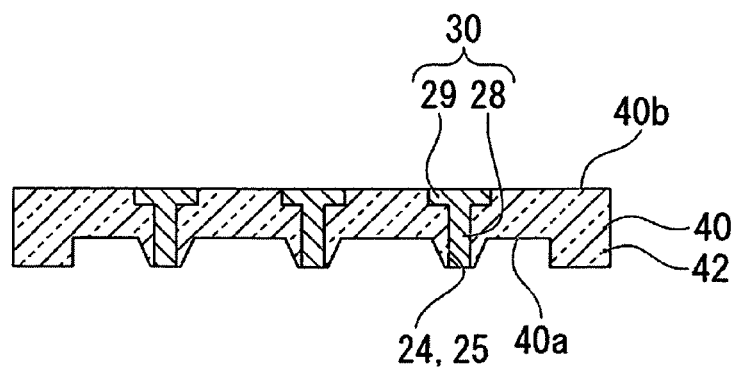

Subsequently, the temperature is reduced gradually from 900° C. at the time of heating in the welding step to cool the base substrate wafer 40 down (S35). Accordingly, the base substrate wafer 40 with the through holes 24 and 25 clogged up with the core members 28 of the rivet members 30 as shown in FIG. 10B is formed. In this case, the projecting portion 42 and the distal end sides of the core members 28 project from the first surface 40a of the base substrate wafer 40, and the base portions 29 of the rivet members 30 are embedded on the side of the second surface 40b, whereby the base portion 29 and the second surface 40b are arranged in flush with each other.

(Grinding Step)

Figure 10C:
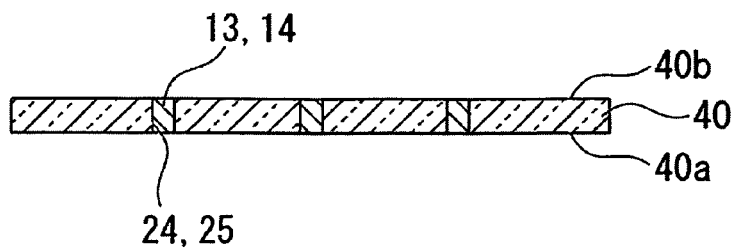

Subsequently, the base substrate wafer 40 is ground (S36). More specifically, the projecting portion 42 and the projecting portions of the core members 28 in the first surface 40a are ground to be removed, and the second surface 40b is ground to remove the base portions 29 embedded in the second surface 40b. Accordingly, as shown in FIG. 10C, the surface of the base substrate wafer 40 and the surfaces of the through electrodes 13 and 14 (the core members 28) are aligned substantially flush with each other. In this manner, the through electrodes 13 and 14 are formed in the base substrate wafer 40. Projecting portions of the base portions 29 and the core members 28 may be used as is without removing.

Substantially, a bonding film forming step (S37) for forming the bonding film 23 by patterning the conductive material on the first surface 40a of the base substrate wafer 40 is performed and a drawing electrode forming step (S38) for patterning the conductive material on the first surface 40a of the base substrate wafer 40 is preformed. In this manner, the base substrate wafer fabricating step (S30) is ended.

Then, the plurality of piezoelectric vibration reeds 4 fabricated in the piezoelectric vibration reed fabricating step (S10) described above are mounted on the respective drawing electrodes 9 and 10 of the base substrate wafer 40 via bumps B of gold or the like, respectively. Then, the base substrate wafer 40 and the lid substrate wafer 50 fabricated in the fabricating step (S50) for the above-described respective substrate wafers 40 and 50 are overlaid on top of another. Accordingly, a state in which the mounted piezoelectric vibration reeds 4 are stored in the cavities C surrounded by the depressed portions 16 formed on the lid substrate wafer 50 and the base substrate wafer 40 is achieved.

After having overlaid the both base substrate wafers 40 and 50 one on top of another, the two respective base substrate wafers 40 and 50 overlaid on top of another are put in an anodic wafer bonding machine, not shown, and a predetermined voltage is applied thereto in a predetermined temperature atmosphere in a state in which outer peripheral portions of the respective substrate wafers 40 and 50 are clamped by a holding mechanism, not shown, for anodically bonding the both base substrate wafers 40 and 50 (S60). Accordingly, the piezoelectric vibration reeds 4 can be sealed in the cavities C, and the bonded wafer member 70 including the base substrate wafer 40 and the lid substrate wafer 50 bonded to each other can be obtained.

Subsequently, a pair of external electrodes 21 and 22 which are electrically connected respectively to a pair of the through electrodes 13 and 14 are formed on the side of the second surface 40b of the base substrate wafer 40 (S70). Then, a cutting step (S80) for cutting the bonded wafer member 70 into pieces along cutting lines M is performed and then an electric characteristic inspection in the interior (S90) is performed, whereby the piezoelectric vibrator 1 in which the piezoelectric vibration reed 4 is stored is formed.

In this manner, in this embodiment, the rivet member receiving portions 67 which can accommodate the distal ends of the core members 28 are formed on the receiving die 63, and the inner surfaces of the rivet member receiving portions 67 are formed into a tapered shape widening from the bottom side to the opening side.

In this configuration, in the welding step (S34), the base substrate wafer 40 is heated while being pressed, whereby the base substrate wafer 40 flows in the forming die 60, and clogs up the gaps between the core members 28 and the through holes 24 and 25, and hence the base substrate wafer 40 is welded to the core members 28. Therefore, formation of gaps between the through electrodes 13 and 14 (the core members 28) and the through holes 24 and 25 is restrained and hence air-tightness in the cavity C is secured.

Here, since the rivet members 30 are welded to the base substrate wafer 40 in a state in which the distal end sides of the core members 28 are held in the rivet member receiving portions 67, the rivet members 30 are prevented from being shifted or inclined from the desired position in the welding step (S34).

In particular, since the rivet member receiving portions 67 are formed into a tapered shape widening from the bottom side toward the opening side, the distal end sides of the core members 28 can enter smoothly from the side of openings of the rivet member receiving portions 67. In contrast, when the core members 28 proceed toward the bottom sides of the rivet member receiving portions 67, the distances between the side surfaces of the core members 28 and the inner surfaces of the rivet member receiving portions 67 are narrowed. Therefore, by pressing the rivet members 30 toward the bottom sides of the rivet member receiving portions 67, the core members 28 can be held at the radially center portions in the rivet member receiving portions 67 without being displaced.

In addition, in the case in which the core members 28 are inserted into the through holes 24 and 25 in an inclined state, the distal ends of the core members 28 move along the inner surfaces (tapered surfaces) of the rivet member receiving portions 67 by pressing the base substrate wafer 40 in the welding step (S34). Accordingly, the core members 28 are guided to the radially center portions of the rivet member receiving portions 67 as they go toward the bottom sides of the rivet member receiving portions 67, and the core members 28 arise gradually. Therefore, when the core members 28 reach the bottom surfaces of the rivet member receiving portions 67, the core members 28 are positioned so that the direction of extension of the core members 28 matches the direction of thickness of the base substrate wafer 40 at the radially center portion of the rivet member receiving portions 67. Accordingly, the positional accuracy of the through electrodes 13 and 14 is improved. Also, in this case, since the core members 28 are welded in a state in which approximately halves of the core members 28 are held in the rivet member receiving portions 67, the positional accuracy of the through electrodes 13 and 14 is reliably improved.

In addition, in this embodiment, in the core member inserting step (S33), the distal end sides of the core members 28 are stored in the rivet member receiving portions 67 when inserting the base substrate wafer 40 into the receiving die 63. In other words, since the procedure can be moved to the welding step (S34) in a state in which the core members 28 are accommodated in the rivet member receiving portions 67, movement of the rivet member 30 in the welding step (S34) can be reliably restrained.

Then, in the piezoelectric vibrator 1 according to this embodiment, since the positional accuracy of the through electrodes 13 and 14 can be improved, continuity between the through electrodes 13 and 14 and the electrode films (the external electrodes 21 and 22 or the drawing electrodes 9 and 10) are secured, and the piezoelectric vibrator 1 with high reliability is provided.

Even when the core members 28 are welded in a state being inclined in the rivet member receiving portions 67 by some chance, the inclination can be restrained to a gradient of the inner surfaces of the rivet member receiving portions 67. When the core members 28 reach the bottom sides of the rivet member receiving portions 67, the distal end sides of the core members 28 are arranged at the radially center portions in the rivet member receiving portions 67. In order to do so, on the side of the first surface 40a where at least the core members 28 are held in the rivet member receiving portions 67, the through electrodes 13 and 14 can be formed at predetermined positions.

Here, in the piezoelectric vibrator 1 according to this embodiment, the piezoelectric vibration reeds 4 are mounted on the first surface 40a (the first surface 2a) of the base substrate wafer 40 (the base substrate 2) via the drawing electrodes 9 and 10. Therefore, a higher positional accuracy of the through electrodes 13 and 14 is required in the first surface 40a of the base substrate wafer 40 in comparison with the second surface 40b (the second surface 2b) side where the external electrodes 21 are formed in a wide range.

Therefore, in this embodiment, by forming the drawing electrodes 9 and 10 on the side of the first surface 40a of the base substrate wafer 40, even when the core members 28 are welded in a state of being held in an inclined state in the rivet member receiving portions 67, continuity between the drawing electrodes 9 and 10 and the through electrodes 13 and 14 is secured.

(Oscillator)

Subsequently, an embodiment of an oscillator according to the invention will be described with reference to FIG. 12.

Figure 12:
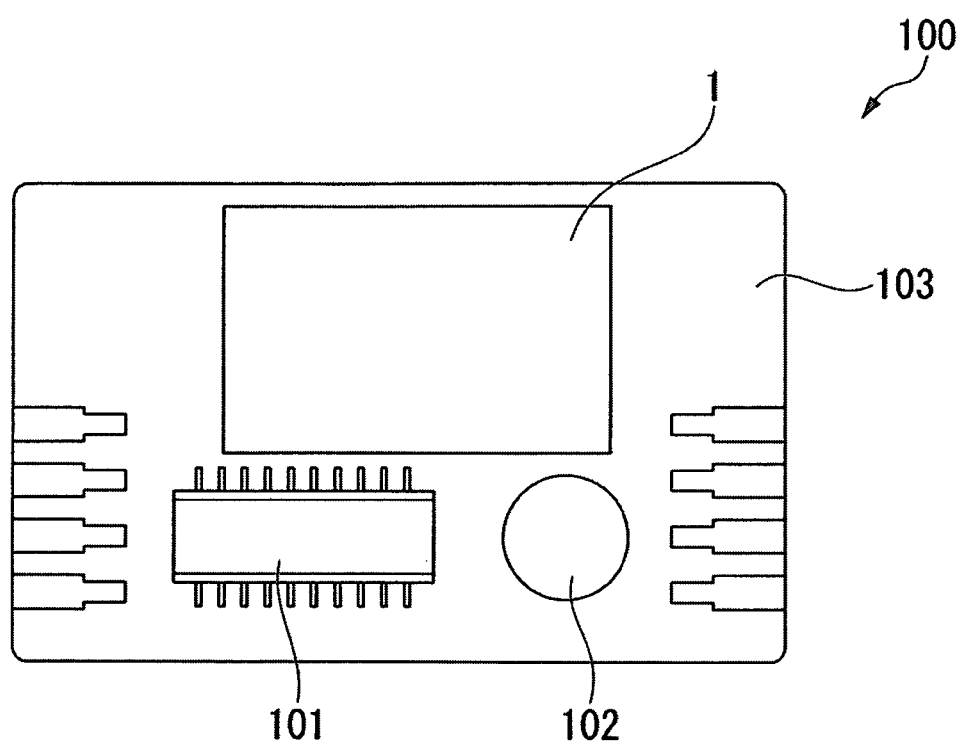
FIG. 12 is a configuration drawing showing an oscillator according to the embodiment.

An oscillator 100 according to the embodiment is configured to include the piezoelectric vibrator 1 as an oscillator electrically connected to an integrated circuit 101 as shown in FIG. 12. The oscillator 100 includes a substrate 103 on which an electronic component 102 such as a capacitor is mounted. The integrated circuit 101 as described above for the oscillator is mounted on the substrate 103, and the piezoelectric vibrator 1 is mounted in the vicinity of the integrated circuit 101. The electronic component 102, the integrated circuit 101, and the piezoelectric vibrator 1 are electrically connected to each other with a wiring pattern, not shown. The respective components are molded by resin, not shown.

In the oscillator 100 configured as described above, when a voltage is applied to the piezoelectric vibrator 1, the piezoelectric vibration reed 4 in the piezoelectric vibrator 1 vibrates. This vibration is converted into an electric signal by the piezoelectric characteristic of the piezoelectric vibration reed 4 and is inputted to the integrated circuit 101 as the electric signal. The supplied electric signal is subjected to various sorts of processing by the integrated circuit 101, and is outputted as a frequency signal. Accordingly, the piezoelectric vibrator 1 functions as an oscillation element.

Also, by selectively setting the configuration of the integrated circuit 101, for example, a RTC (real time clock) module or the like according to the requirement, not only a function as a single function oscillator for a clock, but also a function to control the date of operation or the time instant of the corresponding apparatus or an external apparatus or to provide the time instant or a calendar or the like of the same may be added.

As described above, according to the oscillator 100 in this embodiment, since the piezoelectric vibrator 1 in which the continuity between the piezoelectric vibration reed 4 and the through electrodes 13 and 14 is stable secured is used as described above, the continuity of the oscillator 100 by itself is also stably secured, and the reliability of the operation is enhanced and hence the high quality is achieved. In addition, stable and highly accurate frequency signals can be obtained over a long time.

The technical scope of the invention is not limited to the embodiments shown above, and includes various modifications of the embodiments described above without departing the scope of the invention. In other words, the specific materials or the layer configurations described in the embodiment are examples only, and modifications maybe made as needed.

For example, in the embodiment described above, the piezoelectric vibrator is manufactured by sealing the piezoelectric vibration reed in the interior of the package while using the method of manufacturing the package according to the invention. However, it is also possible to manufacture a device other than the piezoelectric vibrator by sealing an electronic component other than the piezoelectric vibration reed in the interior of the package.

In the above-described embodiment, although the case in which the method of manufacturing the package of the invention is applied to the piezoelectric vibrator has been described, the invention is not limited thereto, and it may be applied to IC, LSI, sensors, and so on.

In the embodiment described above, the through holes 24 and 25 are formed by hot forming of the base substrate wafer 40 by the through hole forming die 57. However, the through holes 24 and 25 may also be formed in the base substrate wafer 40 by sand blasting or the like.

In addition, in the above-described embodiment, the rivet member receiving portions 67 having the inner surfaces formed into the tapered shape hold the core members 28. However, the invention is not limited thereto, and the base portions 29 may be accommodated therein or, alternatively, both the core members 28 and the base portions 29 may be accommodated.

In the embodiment described above, the case where hot forming is performed on the both base substrate wafers 40 and 50 formed of soda-lime glass has been described. However, the invention is not limited thereto, and the borosilicic acid glass (the deformation temperature is on the order of 820° C.) may be hot formed.

In addition, in the above-described embodiment, the case where the invention is applied to a piezoelectric vibrator employing an AT cut type piezoelectric vibration reed (thickness shear vibrations) has been described. However the invention is not limited thereto, and may be applied to a piezoelectric vibrator using a tuning fork shaped piezoelectric vibration reed.

What is claimed is:

1. A method of manufacturing packages in which an electric component can be sealed in a cavity formed between a mutually bonded plurality of substrates, comprising:
   a through electrode forming step for forming a through electrode which penetrates through a through electrode forming substrate out of the plurality of substrates in the thickness direction and brings the inside of the cavity and the outside of the plurality of substrates into continuity, wherein
   the through electrode forming step includes:
   a through hole forming step for forming a through hole in the through electrode forming substrate;
   a metallic pin arranging step for inserting a conductive metallic pin into the through hole; and
   a welding step for welding the through electrode forming substrate to the metallic pin by heating the through electrode forming substrate while pressing the same by a forming die from the both sides in the thickness direction, wherein
   a receiving portion that can receive at least one end side of the metallic pin is formed in the forming die, and
   the receiving portion is formed into a tapered shape having an inner diameter widening from the bottom side to the opening side.

2. The method of manufacturing packages according to claim 1, wherein the length of the metallic pin is longer than the thickness of the through electrode forming substrate, and
   the metallic pin is inserted so as to be projected from the through electrode forming substrate in the thickness direction in the metallic pin arranging step.

3. The method of manufacturing packages according to claim 2, wherein the metallic pin includes a base portion and a core member provided on the surface of the base portion so as to extend upright and configured to be inserted into the through hole in the metallic pin arranging step.

4. The method of manufacturing packages according to claim 1, wherein the metallic pin includes a base portion and a core member provided on the surface of the base portion so as to extend upright and configured to be inserted into the through hole in the metallic pin arranging step.

5. A package manufactured by the method of manufacturing packages according to claim 1.

6. A piezoelectric vibrator comprising a piezoelectric vibration reed hermetically sealed in the cavity of the package according to claim 5 in an air-tight manner.

7. An oscillator comprising the piezoelectric vibrator according to claim 6 electrically connected to an integrated circuit as an oscillation element.

\* \* \* \* \*